United States Patent [19]

De Koning et al.

[11] 4,009,446

[45] Feb. 22, 1977

[54] DUAL DIODE MICROWAVE AMPLIFIER

[75] Inventors: Joseph G. De Koning, Los Altos, Calif.; Robert E. Goldwasser, St. Peters, Mo.; Robert J. Hamilton, Jr., Los Altos, Calif.

[73] Assignee: Varian Associates, Palo Alto, Calif.

[22] Filed: Mar. 19, 1976

[21] Appl. No.: 668,560

[52] U.S. Cl. .................................. 330/34; 330/53; 330/61 A
[51] Int. Cl.² .......................................... H03F 3/10
[58] Field of Search ......... 330/34, 38 M, 53, 61 R, 330/61 A; 333/84 M; 331/96

[56] References Cited

UNITED STATES PATENTS

| | | | |
|---|---|---|---|
| 3,046,363 | 7/1962 | Reynolds | 179/170 |
| 3,069,564 | 12/1962 | De Lange | 307/88.5 |
| 3,105,941 | 10/1963 | Kliphuis | 330/4.9 |
| 3,108,231 | 10/1963 | Carlson et al. | 330/34 |
| 3,127,574 | 3/1964 | Sommers | 331/107 |
| 3,139,533 | 6/1964 | Midkiff | 307/88.5 |
| 3,187,206 | 6/1965 | Marshall | 330/34 |
| 3,255,421 | 6/1966 | Skalski | 330/34 |
| 3,316,421 | 4/1967 | Biard | 307/88.3 |
| 3,453,564 | 7/1969 | Russell | 333/81 |
| 3,457,528 | 7/1969 | Ingerson | 333/80 |
| 3,462,699 | 8/1969 | Sear | 330/34 |
| 3,491,310 | 1/1970 | Hines | 331/96 |
| 3,514,551 | 5/1970 | Freedman | 179/170 |
| 3,562,657 | 2/1971 | Locherer et al. | 330/4.9 |
| 3,614,679 | 10/1971 | Nicolet et al. | 333/80 T |
| 3,796,969 | 3/1974 | Bosch et al. | 332/16 R |

*Primary Examiner*—James B. Mullins
*Attorney, Agent, or Firm*—Stanley Z. Cole; Robert K. Stoddard; Richard B. Nelson

[57] ABSTRACT

A Microwave reflection amplifier having improved gain, bandwidth and noise characteristics, uses two negative-resistance diodes, such as Gunn-effect diodes, connected in series across the terminals. The diodes are series resonated by inductance in their leads. The gain and bandwidth are higher than in amplifiers using a single diode. A shunt-resonant circuit is connected across one diode to improve the gain-bandwidth. A second shunt-resonant circuit may be connected across the terminals. At very high frequencies, the amplifier uses strip-line or microstrip circuitry and the shunt resonators are half-wavelength transmission lines.

16 Claims, 6 Drawing Figures

DUAL DIODE MICROWAVE AMPLIFIER

FIELD OF THE INVENTION

The invention pertains to microwave amplifiers in which an incoming wave on a transmission line is reflected with increased amplitude by a negative-resistance element such as a Gunn-effect diode. An external circulator device separates the input and output waves. Such amplifiers are small and simple and can operate at very high frequency.

PRIOR ART

It was early recognized that the negative resistance exhibited by solid state transferred electron devices could be used to make an amplifier by feeding an input signal to the terminals of such a device and reflecting by the negative resistance a larger output signal which is separated from the input by a transmission-line circulator. The article by B. S. Perlman, C. L. Upadhyayula and W. W. Siekanowitz, "Microwave Properties and Application of Negative Conductance Transferred Electron Amplifiers," Proceedings of the IEEE, Volume 59, pages 1229–1238, August 1971, showed that by proper bias, such an amplifier could be stable and free from oscillation and give six to ten dB gain over a wide frequency band.

Typical prior-art amplifiers used a single diode per stage. For more gain, multiple stages were cascaded. In the paper by J. G. deKoning, R. E. Goldwasser, R. J. Hamilton, Jr. and F. E. Rosztoczy, "Gunn Effect Amplifiers for Microwave Communication Systems in X, Ku and Ka-Bands," IEEE Transactions on Microwave Theory and Techniques, April 1975, pages 367–374, a four-stage amplifier with 30 dB gain is described. When amplifiers are designed for low noise-figure, the available gain-bandwidth product per diode becomes low, so that priorart amplifiers realized only 7 or 8 dB per stage and the required large number of stages resulted in complication and high cost.

U.S. Pat. No. 3,375,454 issued Mar. 26, 1968 to C. S. Aitchison, discloses that with parametric amplifiers, which have some properties similar to the reflection amplifier of the present invention, the bandwidth can be increased by adding a shunt-resonant circuit across the series-resonant negative resistance device. By using two amplifiers spaced one-quarter wavelength apart on a transmission line, Aitchison produces an approximation to the equivalent circuit effect of a combination of series and parallel resonant circuits. A problem is that this circuit is complicated because two complete parametric amplifiers plus the connecting transmission line circuitry must be provided. Also, the quarter-wave line is not a true broadband impedance inverter, so the bandwidth obtainable is limited.

U.S. Pat. No. 3,593,172 issued July 13, 1971 to Berthold Bosch, Wolfgang Heinle and Reinhart Engelmann discloses a reflection amplifier using two Gunn diodes in which one diode oscillates to produce a switch pulse to trigger the other diode above its critical negative-resistance value. This increases the negative conductance of the normally subcritical diode, hence the gain-bandwidth of the amplifier energized by the second diode is increased. However, this amplifier has the disadvantages of high noise figure and a critical bias adjustment. Only one diode actually amplifies the signal, limiting the attainable gain.

SUMMARY OF THE INVENTION

An objective of the present invention is to provide a stable microwave reflection amplifier with high gain and bandwidth per stage.

Another objective is to provide a reflection amplifier with a simple, compact and rugged construction.

A further objective is to provide a reflection amplifier with a low noise figure.

These objectives are attained in the present invention by using two negative-resistance elements such as Gunn diodes in series across the common input and output terminals, each element being series-resonant near or in the operating band. Thus, an increased negative resistance is produced, giving higher gain. One or more shunt-resonant circuits are connected across the series-resonant elements, increasing the gain-bandwidth product. A strip-line circuit construction gives a simple, compact, rugged circuit of low cost.

DESCRIPTION OF THE PREFERRED EMBODIMENTS

Figure 1:
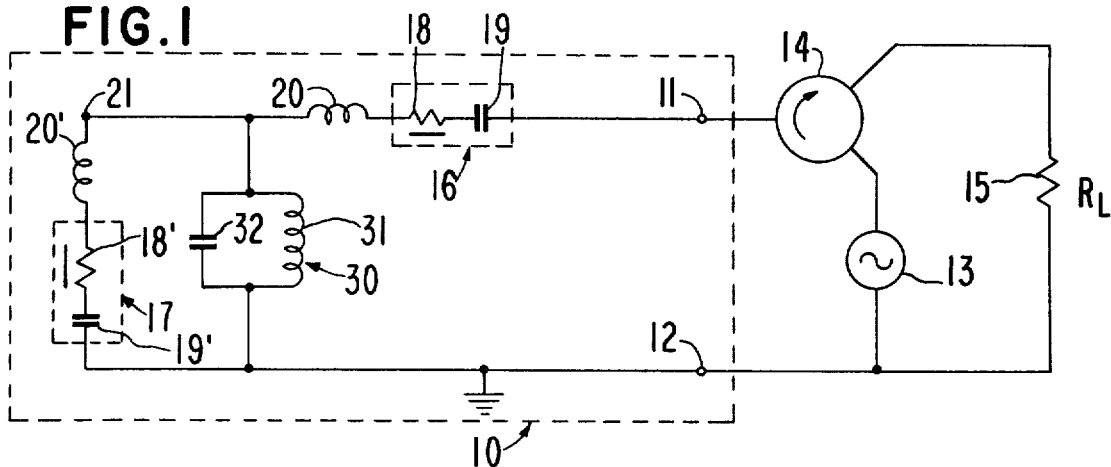
FIG. 1 shows an equivalent lumped-constant circuit diagram of the present invention.
Figure 3:
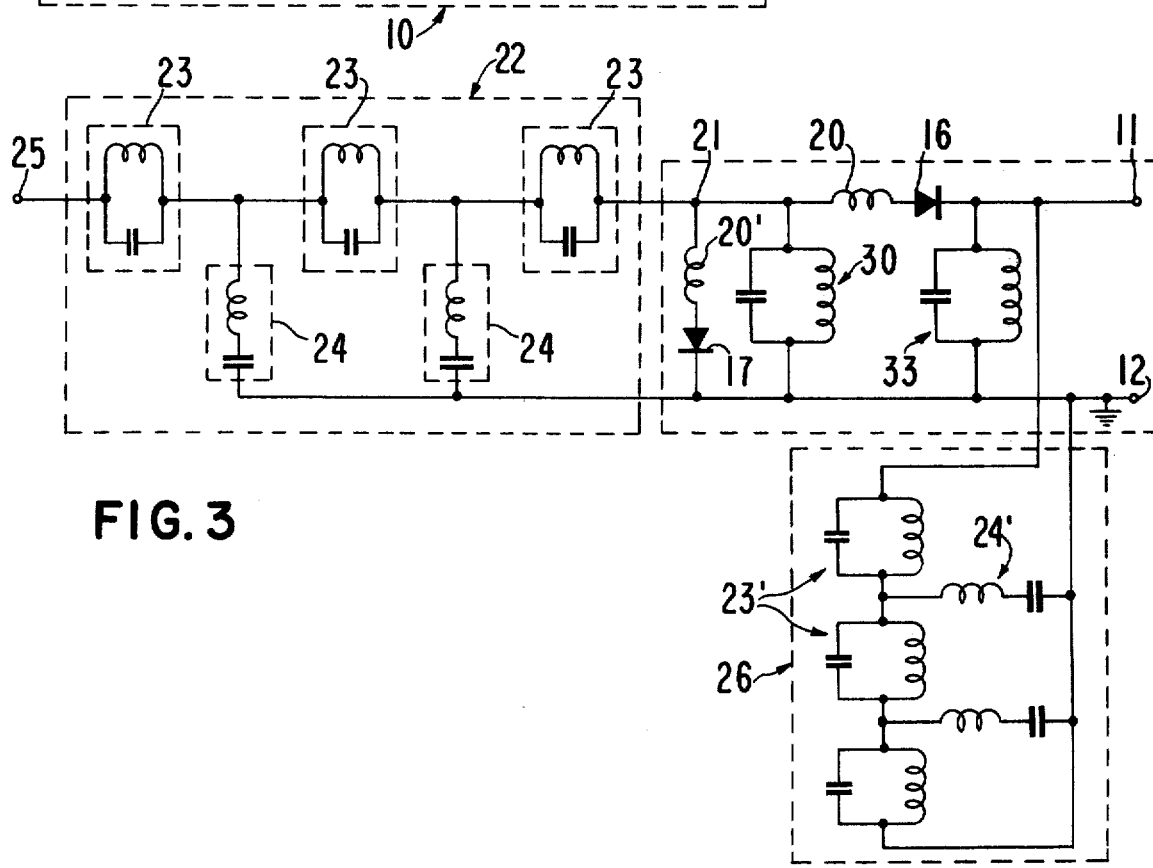
FIG. 3 is an equivalent lumped-constant circuit diagram showing the dc bias current supply with rf chokes.

FIG. 1 is a lumped-constant equivalent circuit of the amplifier of the present invention. It should be remembered that microwave circuits are usually distributed-constant circuits and can only be approximately represented by a lumped-constant diagram. However, the lumped-constant illustration is useful for understanding the operation. For simplicity, FIG. 1 shows only the rf equivalent circuit; the equivalent circuit of the dc paths with rf resonant chokes is shown in FIG. 3.

The negative-resistance amplifier 10 has a single pair of input-output terminals 11, 12, forming its input and output port. Terminal 12 represents a common ground, such as the ground plane of a strip-line circuit or the outer conductors of a coaxial circuit. Microwave energy from a signal source 13 is fed to input terminal 11 through a circulator 14. Returned energy amplified by amplifier 10 is diverted by circulator 14 into the useful load 15. Between input terminals 11 and 12 are connected in series a pair of negative-resistance elements 16, 17, such as Gunn-effect diodes or other negative-resistance devices. Element 16 is represented for rf currents by its active negative-resistance component 18 in series with its self-capacity 19. Each negative-resistance element 16, 17 is made series resonant at a frequency in the vicinity of the operating band, preferably within the band and near its center, by an inductor 20, 20' in series with the negative-resistance element. At the junction 21 between elements 16 and 17, a dc bias is introduced, so that diodes 16 and 17 are in parallel for dc. Across diode 17 and its inductor 20' is connected a shunt circuit 30 comprising parallel inductance 31 and capacitance 32. Circuit 30 is also resonant in the vicinity of the operating frequency band.

The use of two negative-resistance devices in series provides increased effective negative resistance across the circuit and hence increased gain without the complexity of cascaded stages and their additional required circulators. The series resonating inductors 20, 20' tune out the diode capacitive reactances 19, 19' at the resonant frequency, typically at the center of the operating band. Shunt resonator 30, typically resonant near the same frequency, increases the bandwidth over which the reactance is reduced. At frequencies off resonance it adds an effective equivalent series reactance of opposite sign to that of the series resonant circuits.

Figure 2:
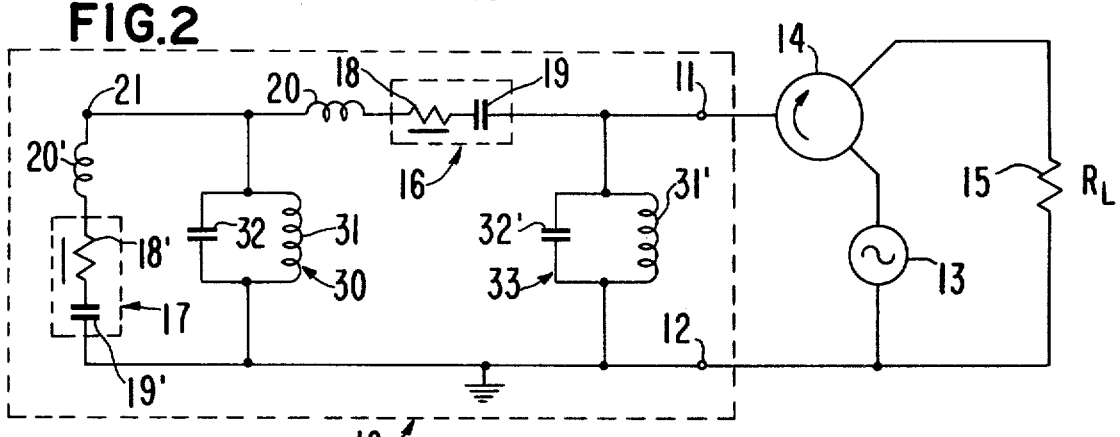
FIG. 2 shows an equivalent lumped-constant circuit diagram of another form of the present invention.

FIG. 2 illustrates a variation of the rf circuit of the invention, where a second shunt-resonant circuit 33 is added across input terminals 11 and 12. For operation at relatively low frequencies such as X-band, the addition of the second shunt-resonant circuit provides improved gain-bandwidth operation.

FIG. 3 is a schematic equivalent circuit including the dc bias choke feed circuitry for the circuit of FIG. 2. Choke 22 is a band-rejection filter connected between the dc supply point 25 and the rf circuit bias input point 21. Choke 22 comprises three equivalent shunt-resonant circuits 23, in series with the supply current to form high impedances for the rf frequency. Connected from the junctions between shunt resonators 23 to ground are equivalent series-resonant circuits 24 to provide low-impedance paths to ground for rf currents. A second, similar rf choke 26 connects input terminal 11 to ground to provide a dc return path for the current through diode 16.

Figure 6:
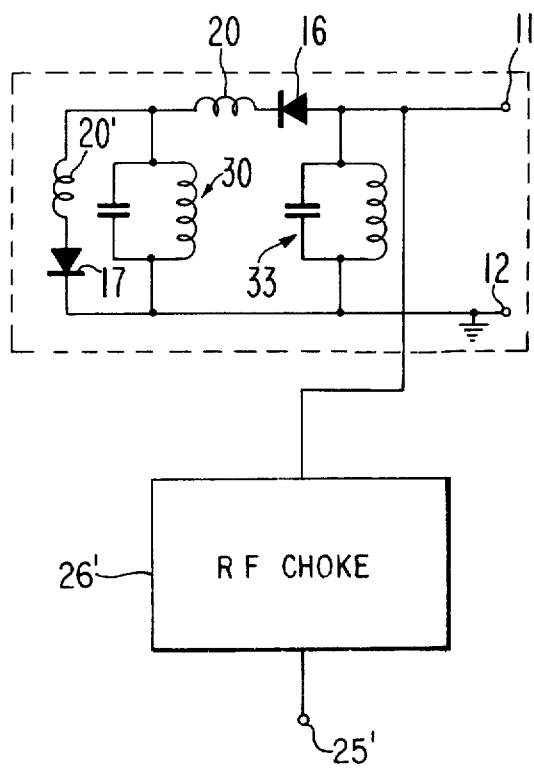
FIG. 6 is an equivalent circuit showing series dc bias.

The circuitry illustrated in FIG. 3 for providing parallel dc bias to diodes 16 and 17 has proven practical. There are also several alternative ways to introduce the bias. As shown in FIG. 6, diodes 16 and 17 can have their dc polarities serially aligned and bias current can be fed through them in series, via an rf choke 26', from input 11 to ground 12, eliminating filter 22. Another way would be to provide an independent bias supply for each diode, which could then be adjusted to optimize its individual performance.

Figure 5:
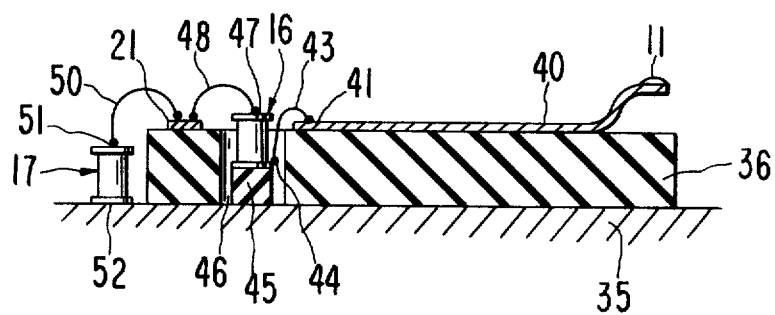
FIG. 5 is a sectional view of the circuit of FIG. 4 taken on lines 5—5.
Figure 4:
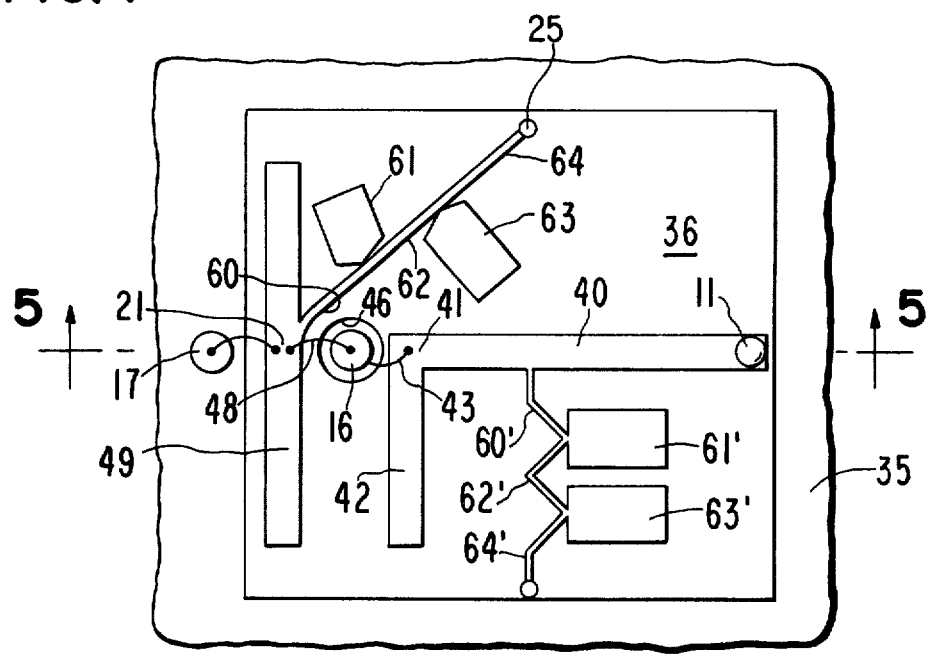
FIG. 4 is a plan view of a strip-line circuit embodiment of the invention.

FIGS. 4 and 5 are a plan view and a section respectively, of a strip-line embodiment of the circuit of FIG. 2, suitable for amplifying frequencies of the order of 10 Gigahertz. Mounted on a metallic base plate 35 is a thin spacer 36 of dielectric, such as a wafer of alumina ceramic 25 mils thick. The strip-line circuit elements are formed by metallized areas on the surface of dielectric wafer 36. The strip-line elements, as of metallic gold, are formed by conventional photoetching techniques. Base plate 35 forms the common ground terminal 12 of FIGS. 1 and 2. Active input terminal 11 leads through strip conductor 40 to the amplifying elements. At its far end 41 a half-wavelength long strip conductor 42 forms the shunt-resonant element 33 of FIG. 2. From point 41, a fine bond wire 43 connects to the lower terminal 44 of the series Gunn diode 16. Diode 16 is mounted on baseplate 35 via a small beryllia block 45 which provides thermal conduction and electrical insulation. Diode 16 and block 45 are located in a hole 46 in dielectric wafer 36. The upper terminal 47 of diode 16 is connected by a second fine bond wire 48 to the center 21 of a second strip-line conductor 49. Bond wires 43 and 48 in series constitute the series resonating inductance 20 of FIG. 2. Conductor 49 is electrically one half-wavelength long on each side of its center point 21 where bond wire 48 is attached. Conductor 49 thus forms two half-wavelength resonant elements, open circuited at their far ends. Together these form the shunt-resonant circuit 30 of FIG. 2 providing an equivalent rf open circuit at the resonant frequency. From point 21 a fine bond wire 50 leads to the upper terminal 51 of diode 17 whose lower terminal 52 is bonded to base plate 35, thus completing the rf circuit. An rf choke for dc bias is formed by strip-line conductors attached to point 21. Three sections 60, 62 and 64 of a narrow, high-impedance strip serially connect point 21 to current supply terminal 25. Sections 60, 62 and 64 are each approximately ¼ wavelength long and correspond to the shunt resonant equivalent circuits 23, of FIG. 3. At the junctions of these series elements are connected low-impedance quarter-wave resonant strips 61 and 63. Being open circuited at their outer ends, resonators 61 and 63 form the series-resonant shunt elements 24 of FIG. 3, presenting at their points of attachment to series elements 60, 62 and 64, a low impedance to ground at the resonant frequency. An exactly similar rf choke comprising series elements 60', 62' and 64', and shunt resonant elements 61' and 63' connects input transmission line 40 to ground, providing a return path for the bias current of diode 16.

With the amplifier of FIGS. 4 and 5, a gain of 11 db has been obtained from 8.4 to 12.4 Gigahertz with two low-noise Gunn diodes producing an amplifier noise figure of 15 to 18 dB. With the amplifier of FIG. 1 a gain of 9 db was obtained from 12.5 to 17.6 Gigahertz with a noise figure of 17 to 18 dB. At still higher frequencies, the intrinsic Q's of the components are so low that the inventive shunt circuits did not improve the gain-bandwidth.

The amplifier of the present invention has been described as illustrated by preferred embodiments. It will be readily apparent to those skilled in the art that many variations of these circuits can be formed without departing from the scope of the invention. The invention is intended to be defined only by the following claims and their legal equivalents.

We claim:

1. A microwave reflection amplifier adapted to operate over a selected frequency band comprising:
   a pair of input-output terminals,
   two negative-resistance elements connected in series across said terminals, each of said negative-resistance elements comprising a negative-resistance diode in series with a resonating inductor,
   means for supplying dc bias to said diodes, and
   a shunt-resonant circuit connected in shunt across one of said negative-resistance elements, said shunt-resonant circuit being shunt-resonant at a frequency in the vicinity of said band.

2. The amplifier of claim 1 wherein said negative-resistance elements are series-resonant at frequencies in the vicinity of said band.

3. The amplifier of claim 1 further comprising a second shunt-resonant circuit connected in shunt across said terminals.

4. The amplifier of claim 1 wherein said means for supplying said dc bias to said diodes is connected to the series circuit of negative-resistance elements at a point between said diodes, whereby said diodes are in parallel across said dc bias.

5. The amplifier of claim 1 wherein said means for supplying said dc bias is connected to the ends of said series connection of negative-resistance elements, whereby said diodes are in series across said dc bias.

6. The amplifier of claim 1 wherein said means for supplying said dc bias comprises a rf choke in the bias supply conductor.

7. The amplifier of claim 1 wherein said resonating inductor comprises a bond wire connecting to one electrode of said diode.

8. The amplifier of claim 1 wherein said shunt-resonant circuit is a resonant section of transmission line.

9. The amplifier of claim 8 wherein said resonant section of said transmission line is an open-circuited section, an integral number of half-wavelengths long at said resonant frequency.

10. The amplifier of claim 3 wherein said second shunt-resonant circuit is a resonant section of transmission line.

11. A negative-resistance device for amplifying microwave signals over a band near a selected frequency comprising:
    conductive ground plate means,
    dielectric spacer means overlaying said ground plate means,
    rf strip-conductor means bonded to said dielectric spacer means on the face opposite said ground plate means, said strip-conductor means comprising, a first element connected to an input terminal, and a second element comprising a section having a shunt resonance near said selected frequency,
    a first negative-resistance means connected between said first and second elements of said conductor means,
    a second negative-resistance means connected between said second element of said strip-conductor means and said ground plate means,
    each of said negative-resistance means comprising a negative-resistance diode in series with an inductor such that said negative-resistance means has a series resonance near said frequency, and
    means for supplying dc bias to said diodes.

12. The amplifier of claim 11 further comprising a second shunt-resonant section of strip-conductor connected to said first element.

13. The device of claim 11 wherein said shunt-resonant section of said strip-conductor means is a section an integral number of half-wavelengths long at said resonance.

14. The device of claim 11 wherein said means for supplying dc bias comprises strip-conductor means connected to said second element.

15. The device of claim 14 wherein said strip-conductor means for supplying dc bias comprises resonant sections of strip conductor forming a rf choke.

16. The device of claim 15 wherein said resonant sections comprise a high-impedance series section approximately ¼ wavelength long connected to a low-impedance shunt section approximately ¼ wavelength long.

* * * * *